United States Patent
Schoo et al.

(10) Patent No.: US 6,326,091 B1
(45) Date of Patent: Dec. 4, 2001

(54) ORGANIC ELECTROLUMINESCENT DEVICE

(75) Inventors: Hermannus F. M. Schoo; Robert J. C. E. Demandt; Jeroen J. M. Vleggaar; Coen T. H. F. Liedenbaum, all of Eindhoven (NL)

(73) Assignee: U. S. Philips Corporation, New York, NY (US)

( * ) Notice: Subject to any disclaimer, the term of this patent is extended or adjusted under 35 U.S.C. 154(b) by 0 days.

(21) Appl. No.: 08/842,525

(22) Filed: Apr. 24, 1997

(30) Foreign Application Priority Data

Apr. 25, 1996 (NL) .................................................. 1002944

(51) Int. Cl.⁷ .................................................. H05B 33/14
(52) U.S. Cl. ........................... 428/690; 428/917; 313/504; 313/506; 257/40
(58) Field of Search .................................... 428/690, 917, 428/691; 313/504, 506; 252/301.33; 345/36, 45, 76; 257/40

(56) References Cited

U.S. PATENT DOCUMENTS

| | | | | |
|---|---|---|---|---|
| 5,378,404 | * | 1/1995 | Han et al. ............................. | 252/500 |
| 5,682,043 | * | 10/1997 | Pei et al. ................................ | 257/40 |
| 5,683,823 | * | 11/1997 | Shi et al. ............................... | 428/690 |
| 5,705,888 | * | 1/1998 | Staring et al. ........................ | 313/503 |
| 5,760,169 | * | 6/1998 | Wudl et al. ........................... | 528/360 |
| 5,767,624 | * | 6/1998 | Gordon, II et al. .................. | 313/509 |
| 5,807,627 | * | 9/1998 | Friend et al. ......................... | 428/212 |

OTHER PUBLICATIONS

"Polyphenylene Vinylene" by Louis M. Leung in Handbook of Thermoplastics by Olagoke Olabisi, Marcel Dekker, New York. (no month) 1997.*

"Conducting Thermoplastics" by Sukumar Maiti in Handbook of Thermoplastics by Olagoke Olabisi, Marcel Dekker, New York. (no month) 1997.*

"Polyelectrolytes" by Peter M. Budd in Comprehensive Polymer Science by Geoffrey Allen, Pergamon Press. (no month) 1989.*

"Polymer Light–Emitting Electrochemical Cells" by Q. Pei et al, Science, vol. 269, Aug. 25, 1995, pp. 1086–1088.

"Photo–and Electroluminescence Efficiency in Poly(di-alkoxy–p–phenylenevinylene)", by D. Braun et al, pp. 75–79, Synthetic Metals, vol. 66 (1994). (no month).

* cited by examiner

*Primary Examiner*—Marie Yamnitzky
(74) *Attorney, Agent, or Firm*—Aaron Waxler

(57) ABSTRACT

An organic electroluminescent device whose electroluminescence efficiency is independent of the work function of the cathode material, and whose service life under ambient conditions is excellent without the necessity of taking additional protective measures. These properties are obtained as a result of the fact that an organic layer of the device comprises mobile ions which are compensated by immobile ions in such a manner than the polarity of all mobile ions is the same.

5 Claims, 3 Drawing Sheets

ORGANIC ELECTROLUMINESCENT DEVICE

BACKGROUND OF THE INVENTION

The invention relates to an electroluminescent device comprising a first electrode, a second electrode and an ionic, organic layer which is in contact with said first electrode, which layer contains a conjugated compound and mobile ions. The invention also relates to a method of manufacturing an electroluminescent device comprising an ionic layer, which layer contains mobile ions.

An electroluminescent (EL) device is a device built up of an electroluminescent layer, which layer emits light when a voltage is applied across electrodes which are in contact with said layer. Such a device can be used, inter alia, as a light source whose light output can be varied in a simple manner by varying the applied voltage. An assembly of independently addressable EL devices, for example in the form of a matrix of light-emitting areas, can be used as a display.

Apart from EL devices based on inorganic materials, such as GaAs, also EL devices based on organic materials are known. Organic EL (oEL) devices on the basis of low-molecular weight materials and on the basis of polymers are known. Known oEL devices are single-layer devices, which means that, apart from the electrodes, the device only comprises the electroluminescent layer, or they are multi-layer devices.

The performance of an organic EL device, measured, for example, in terms of the luminance at a specific voltage, depends to a substantial degree on which electrode materials are used. In general, it is assumed that in the case of electrons, the number of electrons injected depends exponentially on the difference between the work function of the electrode and the electron affinity of the organic layer. In the case of holes, the difference between the work function of the electrode and the ionization potential of the organic layer is of corresponding importance. This dependence applies mutatis mutandis also to the EL efficiency, which is defined as the ratio between the number of photons emitted and the number of charge carriers injected, as said EL efficiency is governed by the ratio between the electron current and the hole current. Consequently, it has been found in practice that in the case of, in particular, single-layer devices, the performance necessary for the above-mentioned applications generally can only be achieved if the negative electrode, also referred to as cathode, comprises a metal having a low work function. A low work function is to be understood to mean herein a work function of approximately 3.0 eV or less. A known electrode material, i.e. calcium, meets this criterion. A disadvantage of such metals is that they degrade under the influence of air. Consequently, the service life of EL devices based on such metals is very limited under atmospheric conditions. A known measure to enable metals having a higher work function to be used as the cathode material consists in incorporating additional layers into the device. In general, the manufacture of such multilayer devices is laborious and expensive. Besides, the performance of the device still depends, in principle, on which electrode material is selected: the work function still has to be attuned to the ionization potential and electron affinity of the layers used. The layers and electrodes can only be optimized in conjunction with each other, not separately. Given the multitude of factors which determine the functionality of a layer, such as the layer thickness, the electrical conductivity, the ionization potential, the electron affinity, the band gap and the photophysics, the optimization of a multilayer device is laborious. Consequently, there is a clear need for a simple, single-layer oEL device, which permits electrodes having a high work function to be used without the performance of the device being adversely affected.

Such a device was described recently by Pei et. al., in Science (1995) vol. 269, 1086. In this known device, referred to as "light-emitting electrochemical cell" (LEC) by Pei et. al., an electrolyte, for example lithiumtrifluoromethanesulphonate, is added to a layer of a known electroluminescent material, such as a poly (phenylenevinylene), which causes, according to said publication, a p-n junction to be formed in situ by means of electrochemical doping of the EL material. This measure results, inter alia, in that the device emits light already at a voltage which corresponds approximately to the band gap of the EL material and in that EL efficiencies comparable to known polymer-based EL devices (pEL) are achieved while using electrode materials having a high work function such as gold and aluminium.

However, the known LEC has disadvantages. Although the known LEC makes use of electrodes having a high work function, this has no effect on the service life. Said service life is comparable to that of corresponding devices in which a cathode having a low work function is used instead of an electrolyte. As explained hereinabove, the service life of the latter devices under ambient conditions is very limited and definitely insufficient for the intended applications. A further disadvantages is that by means of diffusion the electrolyte can move through every organic layer while preserving its charge neutrality. Consequently, a multilayer construction of the known LEC in which only one layer contains the electrolyte is not feasible. In addition, it is difficult to disperse the electrolyte on a molecular scale in the customary EL materials, which, in general, are non-ionic and predominantly apolar.

OBJECTS AND SUMMARY OF THE INVENTION

It is an object of the invention, inter alia, to provide an oEL device which does not have the above-mentioned drawbacks. The invention specifically aims at an oEL device whose service life under ambient conditions is much better, even without particular protective measures, than that of comparable, known LEC devices, even when the air is saturated with water vapour. Said device should have a good EL efficiency and have a satisfactory light output already at a low voltage. In addition, the EL efficiency of the device should be substantially independent of the work function of the electrodes used, so that it is possible, inter alia, to use a material having a high work function as the cathode material or to use the same material for both the anode and the cathode. The expression "substantially independent" is to be understood to mean herein that the charge injection is no longer determined by the above-mentioned exponential dependence. A further object is to disperse the ions of the electrolyte on a molecular scale. It should be possible to choose the ionic characteristics of a layer substantially independently of the charge-transporting and electroluminescent characteristics of the layer. The expression "charge transport" is to be understood to mean only the transport of electrons and holes necessary for the electroluminescence, not the transport of ions. In the case of a multilayer structure, it should be possible, if necessary, to limit the presence of ions of a specific polarity to one or more layers. It should also be possible to manufacture the single-layer or multi-layer EL device in a simple manner. In particular, it should be possible to achieve the intended properties with oEL devices which are exposed to ambient conditions during their manufacture.

These and other objects are achieved by means of an EL device of the type mentioned in the opening paragraph, which is characterized, in accordance with the invention, in that either only negatively charged ions or only positively charged ions are mobile relative to the first electrode. It has been found that the service life, under ambient conditions, of the EL device manufactured in accordance with the invention is much longer than that of comparable, known LEC devices in which both positive and negative mobile ions are used. Said service life is achieved without taking any protective measures. It has even been found that such devices can be operated for days in an atmosphere saturated with water vapour. It has also been found that a service life of several months in combination with good performances can be readily achieved. In a typical example, the EL efficiency was approximately 1.5% and the light output was approximately 500 Cd/m$^2$ at 5 V, while using a gold cathode and an indium tin oxide (ITO) anode.

For the cathode material use can suitably be made of materials having a high work function. In fact, the EL efficiency is substantially independent of the choice of the cathode material. Examples of suitable cathode materials are gold, platinum and other noble metals, aluminium, indium tin oxides.

For the electrode material use is advantageously made of metals which can be provided in liquid form, such as indium. They can be provided in a simple manner and an electrode thus formed proves to be non-porous. The absence of porosity has a favourable effect on the service life.

Said cathode materials can also suitably be used as anode materials. If the EL device has a "sandwich" structure, it is advantageous to use an electrode material which is transparent to the light to be emitted, such as an indium tin oxide (ITO). The presence of mobile ions compensated by immobile ions creates a "restoring force" if said mobile ions have been moved under the influence of an electric field or diffusion, which restoring force, in the case of multilayer devices as will be described hereinbelow, can be advantageously used. The inventive EL devices can be manufactured in a simple manner, while being exposed to air, by methods which are known per se.

In accordance with the invention, not only mobile ions but also immobile ions are present which serve to compensate the charge of the mobile ions. Charge neutrality is assumed, although it is not a prerequisite for all intended purposes. The mobility of ions depends, inter alia, on the temperature and the matrix in which they are present. For example, the mobility can be increased by gelation by adding a suitable solvent and/or heating. Other important factors are the size of the ion and the strength of the bond between oppositely charged ions. Preferably, a mobile ion is small and soft, and an immobile ion is large. The mobility of a mobile ion should be as high as possible. Dependent upon the applications, a suitable mobility of a mobile ion is $10^{-14}$ cm$^2$/Vs or more. The mobility of a suitable immobile ion is approximately $10^{-19}$ cm$^2$/Vs or less. Mobile as well as immobile ions should be chemically inert, particularly under the operating conditions of the device.

Suitable mobile anions are ions which are derived from, for example, Bronsted acids, such as halogenides, in particular I$^-$, tosylates, triflates, carboxylates or Lewis-acid anions, such as BF$_4^-$. The mobile anions can be exchanged for others in a simple manner. Suitable mobile cations are, for example, alkaline (earth) metal ions, such as Na$^+$ or K$^+$, or quaternary ammonium compounds, taking the above general guide lines into consideration. In the case of very small cations, such as Li$^+$ or maybe even H$^+$, it is desirable to use an ion-conducting polymer, such as polyethylene oxide.

The ionic layer can only suitably be used in an EL device if a conjugated compound is present which transports the injected charges. If a single-layer device is used, the presence of a conjugated compound having an EL property in the ionic layer will additionally be necessary, which compound is often identical to the charge-transporting compound. By means of mixing or synthesis, the ionogenic compound can be combined with known charge-transporting and EL compounds, such as low-molecular weight fluorescent dyes, in particular coumarines, EL polymers, in particular polyphenylenevinylenes, or high-molecular or low-molecular weight derivatives of phenyl-biphenyl-1,3,4-oxadiazole or triphenylamine dimer or polyvinylcarbazole. It is required, however, that the ionogenic compound leaves the charge-transporting and/or electroluminescent properties of the layer obtained by using the conjugated compound substantially unchanged. This requirement will be met if the ionogenic compound has a much larger band gap and ionization potential and a much smaller electron affinity than the conjugated compound.

The ionic layer can be manufactured by means of methods which are known per se. Layer thicknesses vary typically from 25 to 500 nm, in particular from 50 to 150 nm.

The time-dependence of the current-voltage characteristic (CV) and of the luminance-voltage characteristic (LV) of the EL device in accordance with the invention was found to differ from that of the conventional devices in which no mobile ions are used. In operation, the CV characteristic of the latter devices is initially constant as a function of time, but deteriorates gradually, i.e. as a result of degradation, a constantly increasing voltage is necessary to maintain a constant current. However, the CV and LV characteristics of the device in accordance with the invention improve with time, i.e. the voltage required to obtain a specific current decreases continuously. In other words, at a constant voltage, the current and the luminance increase. Also the EL efficiency of the device improves, values of at least 1.0 to 1.5% being feasible. Only after a long period of time, typically several days to months the performance of the device decreases as a result of degradation. The time interval within which the improvement of the CV characteristic takes place can be shortened by a so-called activating operation. The term "activation" is to be understood to mean that a higher voltage is temporarily applied. This voltage typically is a factor of 2 to 4 higher than the voltage used during the life test. If the device is switched off for a short period of time, typically approximately ten seconds, almost immediately the same characteristic as after activating is obtained. If the device is switched off for a long period of time, for example approximately 10 minutes, the improvement stage has to be covered again. In accordance with the finding that the performance of the device is substantially independent of the electrode materials used, the performance obtained in "reverse bias" is comparable to that obtained in "forward bias". The stability of the electrode material may differ as a function of the polarity of the applied voltage. It has been found that the activating time depends on the mobility of the ions. Shorter times suffice if the device is heated or if the ionic layer is gelated by means of a solvent. The activating time is also shorter as the layer is thinner.

It has been found that the service life of the device in accordance with the invention can be improved further by using an additional layer. Consequently, a preferred embodiment of the EL device in accordance with the invention is characterized in that said device comprises an additional layer, which layer is situated between the second electrode and the ionic layer and which contains a conjugated compound as well as such a quantity of mobile ions that the overall charge of these mobile ions is substantially compensated by immobile ions of the ionic layer. It is noted that the qualification "ionic layer" only makes sense in multilayer devices if immobile ions are used, which are substantially absent in the additional layer. Unlike known multilayer devices, the resultant freedom of construction does not have to be sacrificed to the attunement of the electron affinity and ionization potential of the relevant materials to the work function of the electrodes, as electrode-independence is guaranteed substantially by the presence of the ions. Both the additional layer and the ionic layer can be used as an EL and/or charge-transporting layer.

Suitable materials for the additional layer are the known EL and charge-transporting materials, such as a poly (phenylenevinylene). It is alternatively possible to use various additional layers, but this leads to a greater complexity. In a particular suitable configuration, the second electrode is used as the negative electrode, as in general the injection or charge transport of electrons needs to be improved. A particular, preferred embodiment of the EL device is characterized in accordance with the invention in that the ionic layer and the additional layer have substantially identical fluorescence spectra, ionization potentials and electron affinities. As the difference between the ionic layer and the additional layer consists merely in the presence and absence, respectively, of immobile ions, the conjugated parts can be selected so that the above characteristic is satisfied. This is in contrast to known multilayer devices in which a plurality of layers are used to create differences in ionization potential, electron affinity or fluorescence spectrum. The EL device in accordance with the invention combines the advantages of monolayer and multilayer devices. Such a device can be manufactured in a simple manner by successively providing the two layers or by using an inventive method which will be described in greater detail hereinbelow.

Another preferred embodiment of the EL device in accordance with the invention is characterized in that the immobile ion is formed by a charged substituent which is linked to the conjugated compound by means of a covalent, saturated bond. By combining the ionogenic and conjugated properties in one compound, the necessity of mixing various compounds can be dispensed with. A problem which often occurs during mixing is phase separation. This occurs, in particular, if ionogenic materials have to be mixed with non-ionogenic materials. As regards the intended device, however, it is advantageous to disperse the ions on a molecular scale. The ionogenic property can be introduced synthetically by using a charge group as the substituent of the conjugated compound. By linking the substituent by means of a covalent, saturated bond, the ionogenic property and the conjugated property can be introduced with a minimum of mutual interference. Therefore, suitable compounds can be obtained in a simple manner by combining suitable conjugated and ionogenic compounds.

A particular, preferred embodiment of the EL device in accordance with the invention is characterized in that the immobile ion of the ion layer is formed by a polymer. The use of polymeric materials has advantages. The high-molecular weight ensures that the ionic portions which form part of the polymer are indeed immobile. Further, polymers are, in general, readily processable, amorphous and suitable for producing flexible devices having large surface areas by using simple techniques such as spin coating. Examples of commercially available ionogenic polymers are, for example, polystyrenesulphonate or poly(meth)acrylate. Other polyelectrolytes can readily be obtained synthetically. To ensure dispersion on a molecular scale, it is of course possible again to combine the ionic property and the conjugated property in one compound. In the case of polymers, this is very advantageous. The mixing of two polymers will almost always give rise to phase separation if no special measures, such as the addition of "compatibilizers", are taken.

A further preferred embodiment of the EL device in accordance with the invention is characterized in that the ionic layer comprises a quaternary amine as the immobile ion. The expression "quaternary amines" is to be understood to mean herein amines which can be obtained from their neutral counterpart by means of an alkylation agent. Consequently, quaternary amines also include quaternized aromatic amines such as the pyridinium compounds. These ions can be provided in the ionic layer, inter alia, by means of an inventive method, referred to as quaternization, which will be explained in greater detail hereinbelow. As a result of the fact that, in this case, the ionic property is not introduced until after the layer has been formed, problems regarding phase separation as a result of the presence of the ions can be precluded. A multilayer device can also be manufactured in this manner.

A particularly suitable embodiment of the EL device in accordance with the invention is characterized in that the ionic layer comprises a conjugated poly(p-phenylenevinylene. Poly-p-phenylenevinylenes are very suitable EL materials. They exhibit a high degree of fluorescence and a satisfactory electroconductivity. The emission spectrum can be varied and readily soluble and processable variants can be obtained by means of substitution, in particular, in positions 2 and 5 of the phenyl ring.

A very suitable, preferred embodiment of the EL device in accordance with the invention is characterized in that the ionic layer comprises a copolymer in accordance with formula (IA/IB) or (II),

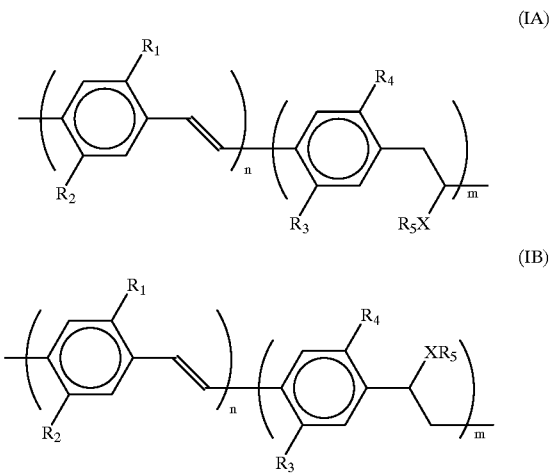

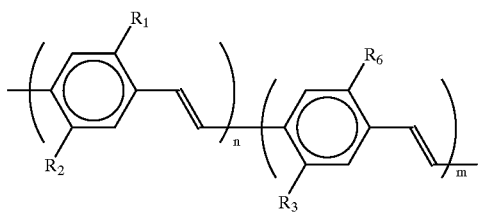

(II)

wherein the degree of polymerization n+m varies from 5 to 1,000,000, $R_1$, $R_2$, $R_3$, $R_4$ are chosen to be equal or unequal to —X—R—H or —R—H, $R_5$ is —R—$K_1A_1$ or —R—$A_2K_2$ and $R_6$ is equal to $R_5$ or to —X—$R_5$, wherein R is a branched or unbranched $C_{1-C20}$ alkylene or phenylene-alkylene, X is sulphur or oxygen, $K_1$ is an ammonium group, $A_1$ is selected from the group formed by $I^-$, $Tos^-$ or other Bronsted-acid anions, $A_2$ is —$CO_2^-$ or —$SO_3^-$ and $K_2$ is selected from the group formed by $NR_4^+$, alkali. These compounds can be synthesized in a simple manner by means of known methods, are soluble and can readily be processed to form amorphous layers in which the ions are dispersed on a molecular scale. Preferably, the fraction m/(n+m) in polymers in accordance with formula (IA/IB) is below 0.15 and above 0.001. Higher values cause the service life to be shortened as a result of an interruption of the conjugation, whereas lower values require an ever longer activating time. In the case of polymers in accordance with formula (II), the fraction m/(n+m) can be varied between 0 and 1, preferably the fraction is greater than 0.001 and smaller than 0.1. The smaller the fraction, the longer the necessary activating time is. At values above 0.1, a substantial improvement is no longer achieved. It has been found that the service life of EL devices prepared by means of polymers (II) is better than that of comparable devices prepared by means of polymers in accordance with formula (IA/IB). It has also been found that, under otherwise equal conditions, the voltage necessary to attain a specific current intensity is lower in devices based on polymers in accordance with formula (II). If polymers in accordance with formula (II) are used, the device can even be operated in air saturated with water vapour for several days.

The presence of non-ionic substituents promotes the solubility. With a view thereto, it is advantageous to choose substituents of unequal length and/or branched substituents. The use of alkylene substituents longer than $C_{20}$ hardly leads to a further increase in solubility, whereas the quantity of active material is reduced. The solubility is also determined by the nature of the mobile counterion. For example, polymers in which the tosylate ion is used as the counterion can more readily by dissolved in toluene than the same polymer in which iodide is used as the counterion.

A very advantageous embodiment is characterized in accordance with the invention in that the ionic layer comprises a copolymer in accordance with formula (II), wherein the degree of polymerization n+m varies from 5 to 1,000,000, $R_1$ is methoxy, $R_2$ is 3,7-dimethyloctyloxy, $R_3$ is methoxy and $R_6$ is [—$CH_2CH_2N(CH_3)_3$]$^{+/-}$.

The invention also relates to a method of manufacturing an EL device. In accordance with this method, a first electrode is provided with an ionic layer on which, subsequently, a second electrode is provided, which method is characterized in accordance with the invention in that the ionic layer comprises a compound which can be alkylated, and, before the second electrode is provided, the ionic layer is exposed to an alkylating agent, so that ions are formed in the regions exposed to said agent. An advantage of this method, referred to as quaternization, is that the ionic property is not introduced until the moment when the morphology of the layer has been fixed, thereby precluding phase separation which could occur as a result of the presence of ions. A further advantage is that a multilayer device can be manufactured from a single-layer device in a simple manner by exposing the layer comprising the compound which can be alkylated, that is the precursor layer, to an alkylating agent for a shorter period of time than would be required for complete alkylation, so that the ionic layer and the additional layer are simultaneously formed from the precursor layer. The transition from the alkylated, ionic layer to the non-ionic, additional layer is given by the diffusion profile of the alkylating agent and will be governed by the selected process conditions. Suitable compounds which can be alkylated are compounds whose alkylated product is stable. Dependent upon the strength of the alkylating agent, it is generally required that the compound to be alkylated comprises a lone pair which is associated with an oxygen atom, sulphur atom or nitrogen atom. Particularly suitable representatives of this class of materials are tertiary amines because, in general, they lead to very stable alkylated compounds. The alkylating agent should be selected so that no undesirable side reactions occur. Suitable alkylating agents for amines are, for example, alkylhalides and alkyltosylates. Particularly suitable alkylating agents are the gaseous methyliodide and alkyltosylates which can be dissolved in customary solvents.

These and other aspects of the invention will be apparent from and elucidated with reference to the embodiments described hereinafter.

DESCRIPTION OF THE PREFERRED EMBODIMENTS

Synthetic recipe 1

The polymer according to formula (IA/IB)

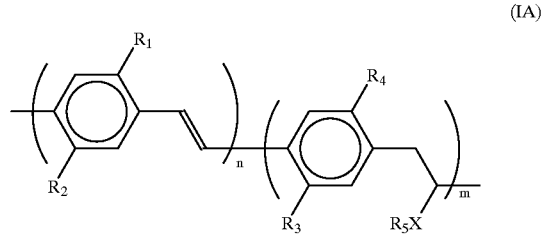

(IA)

-continued

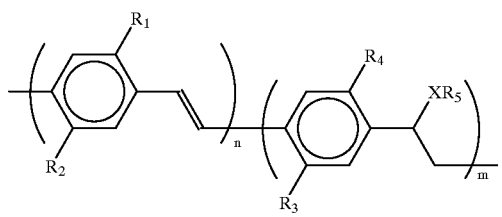

(IB)

Figure 1:
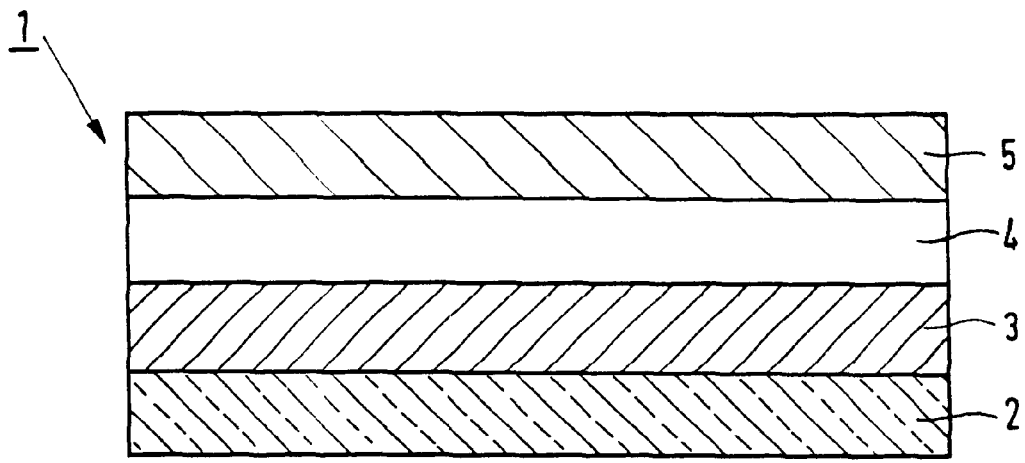
FIG. 1 is a cross-sectional view of a single-layer device in accordance with the invention.

with $R_1$ and $R_3$ equal to 3,7-dimethyloctyl, $R_2$ and $R_4$ equal to methyl and $R_5$ equal to $[—CH_2CH_2N(CH_3)_3]^+I^-$ and X is O is obtained as follows.

In a 500 ml three-necked flask in nitrogen, 2 g of 2-methyl-5-(3,7-dimethyloctyl)-1,4-chloromethylbenzene (Syncom bv, University of Groningen, The Netherlands) is dissolved in 500 ml of dry tetrahydrofuran (THF). The solution is heated to 30° C. and an equimolar amount of potassium-t-butylate (tBuOK) in 100 ml dry THF is added slowly. The THF is evaporated at 30° C. and 500 ml of cyclohexanone or diglym is added. A quantity of 0.2 mol dimethylaminoethanol and 5 ml di-isopropylethylamine are added to the solution thus obtained. As empirically established by NMR, 0.2 mol dimethylaminoethanol corresponds to a ratio m/(n+m) of approximately 0.1 in the final product. The solution is heated in nitrogen at 140° C. for 20 h. The solution is cooled and the polymer is precipitated in methanol, filtered, washed with methanol and dried in a vacuum. Further purification may be effectuated by dissolving the polymer in THF, to which 0.5 wt % of di-isopropylethylamine is added, and subsequently precipitating it by slowly adding methanol.

Quaternization of the amino group is performed by dissolving the polymer in THF, 1 wt %, and treating it with 3 molar equivalents of methyliodide at room temperature for 2 hours.

The resulting mixture may be purified by precipitation by adding methanol and subsequent drying. The quaternized polymer thus obtained shows a bright green photo- and electroluminescence substantially equivalent to its counterpart without the ammonium group. The polymer is soluble up to approximately 2 wt % in solvents such as chloroform, THF, cyclohexanone.

An alternative quaternization procedure using ethyltosylate reads as follows. The amino-polymer is dissolved in THF (about 1 wt %) and treated with 3 molar equivalents ethyltosylate at room temperature for 2 hours, after which it may be purified by precipitation in methanol. This gives the quaternized polymer with a tosylate counterion, the solubility of which in apolar organic solvents is improved as compared to polymers quaternized with methyliodide. Their electrical and electroluminescent properties are comparable.

Other polymers prepared according to the above procedure are those in which $R_1$ to $R_4$ have the above-mentioned meaning and $R_5$ is selected from the group formed by $[—(CH_2)_2NHCH_3]^+I^-$, $—(CH_2)_{11}C(=O)ONa$, $—(CH_2)_2SO_3Na$, with the proviso that anionic polymers are of course not quaternized.

Other polymers according to formula (I) can be obtained by a similar procedure by selection of the proper monomer, primary alcohol or thiol and alkylating agent. The fraction of unconjugated repeating units can be controlled by the amount of primary alcohol or thiol added.

Synthetic recipe 2
The polymer according to formula (II)

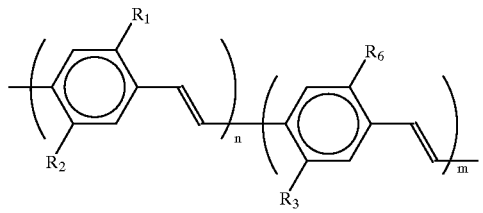

(II)

with $R_2$ and $R_3$ equal to methoxy, $R_1$ equal to 3,7-dimethyloctyloxy and $R_6$ equal to $[—OCH_2CH_2N(CH_3)_3]^+I^-$ is obtained as follows.

In a 500 ml three-neck flask in nitrogen, 1.7 g of 2-methoxy-5-(3,7-dimethyloctyloxy)-1,4-chloromethylbenzene (Syncom bv, University of Groningen, The Netherlands) and 0.3 g of the HCl-salt of 2-methoxy-5-(dimethylaminoethoxy)-1,4-chloromethylbenzene (Syncom bv, University of Groningen, The Netherlands) are dissolved in 500 ml of dried THF. To dissolve the salt 5 ml of di-isopropylethylamine is added. The solution is heated to 30° C. and a solution of 2.5 molar equivalents of potassium-t-butylate (tBuOK) in 100 ml dried THF is added slowly in approximately 5 minutes. This solution is allowed to react for 10 min. Then a solution of 6 to 10 molar equivalents of t-BuOK in 100 ml of THF is added quickly and is allowed to react for 15 to 20 h. After 15 to 20 h the reaction mixture is quenched with 20 ml of acetic acid in 20 ml of THF. The acidic solution is stirred for another 2 h. The volume of the solution is reduced to 50% of the original volume, and 500 ml of methanol/water (5:1) is added slowly to the solution while stirring vigorously. The polymer is filtered, washed with methanol/water (5:1) and dried in a vacuum. To purify the polymer, it is dissolved in THF (0.75 wt %) and fractionated with 500 ml of methanol (3 times). The resultant polymer is soluble in toluene, THF, chloroform up to 1 wt % and the ratio m/(n+m), as determined by NMR, is 0.07.

If desired, the amino group is quaternized by stirring a <1 wt % THF solution of the polymer with 3 molar equivalents of methyliodide for 4 h at room temperature. The quaternized polymer thus obtained shows a bright orange photo- and electroluminescence which is essentially identical to the counterpart without the ammonium group.

Alternatively, ethyltosylate may be used as the alkylating agent.

Polymers which are also prepared according to the above procedure are those in which $R_1$ is equal to 3,7-dimethyloctyloxy, $R_2$ and $R_3$ are equal to methoxy, $R_6$ is equal to $—O—(CH_2)_p—N(CH_3)_3^+$ and p and q=m/(n+m) are chosen according to the table below.

| p | 2 | 2 | 2 | 2 | 2 | 2 | 6 | 6 | 6 | 6 | 2 |
| q | .01 | .03 | .04 | .07 | .10 | 1.0 | 1.0 | .50 | .25 | .10 | .03 |

A polymer which is also prepared according to the above procedure is characterized in that $R_1$ is equal to methyl, $R_2$ is equal to 4,6-dimethylheptyl, $R_3$ is equal to methoxy, and $R_6$ is equal to $[—OCH_2CH_2N(CH_3)_3]^+I^-$, which polymer exhibits a bright green photoluminescence; the polymer with $R_1$ equal to hydrogen, $R_2$ equal to 3-methoxyphenyl, $R_3$ equal to methoxy, and $R_6$ equal to $[—OCH_2CH_2N(CH_3)_3]^+$ I⁻ also exhibits a bright green photoluminescence. Terpolymers derived from monomers which in homopolymeric form luminesce orange and green, respectively, show a yellow-coloured photoluminescence.

Other polymers according to formula (II) can be obtained by a similar procedure by selection of the proper monomers containing a 1,4-chloromethylbenzene moiety and an alkylating agent. The ratio n/(n+m) can be varied by a variation of the molar ratio of the monomers. Also, by mixing the proper number of monomers, terpolymers and higher are available through this procedure. Characteristic data relating to molecular weight as determined by GPC against polystyrene standards are $M_n=10^5$ and $M_w/M_n=8$. If kept in the dark, the shelf life of these compounds is substantially unlimited.

Synthetic recipe 3

The counterions of quaternized polymers according to formula (IA/IB) and (II) can be exchanged as follows. The quaternized polymer is dissolved in THF (<1 wt %) and a mixture (1:1) of acetone and water is added to such an extent that the polymer is about to undergo phase separation. Then the solution is saturated with $K_2CO_3$, stirred for 30 minutes, and precipitated in MeOH/water (1:1). This process is repeated twice. The polymer now has $CO_3^{2-}$ and/or $HCO_3^-$ as a counterion, which can be replaced by any other counterion X⁻ by adding its acidic form HX to a solution of the polymer in THF/water and gently heating it to remove $CO_2$.

Synthetic recipe 4

The synthesis of anionic polymers (II) is illustrated by the synthesis of the polymer in which $R_1$ is equal to 3,7-dimethyloctyloxy, $R_2$ and $R_3$ are equal to methoxy, $R_6$ is equal to —O—$(CH_2)_4C(CH_3)_2$COOH.

In a 500 ml three-neck flask in nitrogen, 1.9 g of 2-methoxy-5-(3,7-dimethyloctyloxy)-1,4-chloromethylbenzene (Syncom bv, University of Groningen, The Netherlands) and 0.1 g of 6-(2,5-bischloromethyl-4-methoxyphenoxy)-2,2-dimethylhexanoic acid (Syncom bv, University of Groningen, The Netherlands) are dissolved in 500 ml of dried THF. To dissolve the acid, 1 ml of di-isopropylethylamine is added. The solution is heated to 30° C. and a solution of 2.5 molar equivalents potassium-t-butylate in 100 ml dried THF is added slowly in approximately 5 min. This solution is allowed to react for 15 to 20 h. After 20 min the solution is dark red. After 15 to 20 h the reaction mixture is quenched with 20 ml acetic acid in 20 ml of THF. The acidic solution is stirred for another 2 h. The solution turns bright orange. The volume of the solution is reduced to 50% of its original volume and 500 ml of methanol/water (5:1) is slowly added to the solution while stirring vigorously. The polymer is filtered, washed with methanol/water (5:1) and dried in a vacuum. The polymer thus obtained, contains about 5% of the acid monomer. The polymer is soluble in toluene, THF and chloroform up to 1%.

A polymer which has also been prepared is characterized in that $R_6$ equals 2,2 dimethylbutoxycarbonic acid which is soluble in acetone, DMSO, cyclohexanone and DMF if a small amount of a tertiary amine, such as di-isopropylethylamine, is added as well.

Exemplary embodiment 1

FIG. 1 shows, schematically and not to scale, a cross-sectional view of an EL device 1 in accordance with the invention, which device can be manufactured as follows. A glass substrate 2 which is transparent to the light to be emitted is provided with a transparent layer of indium tin oxide (ITO) 3 by means of sputtering, said layer having a thickness of approximately 150 nm and a surface resistance of less than 20 Ω/square. This layer is provided, by means of spin coating from a 1 wt. % solution in THF/toluene (1:3), with an ionic layer 4 of a polymer in accordance with formula (IA/IB), wherein $R_1$ and $R_2$ are 3,7-dimethyloctyloxy, $R_2$ and $R_4$ are methoxy, $R_5$ is [—$CH_2CH_2N(CH_3)_3$]⁺I⁻, m/(m+n) is 0.08, which polymer is obtained in accordance with synthetic recipe 1. The thickness of the layer is approximately 300 nm. The layer obtained is an amorphous, non-diffusing layer which photoluminesces orange light. Subsequently, a 150 nm thick, gold electrode layer 5 is provided on said layer by means of vacuum deposition. The surface area of the device amounts to approximately 0.9 cm².

Figure 3A:
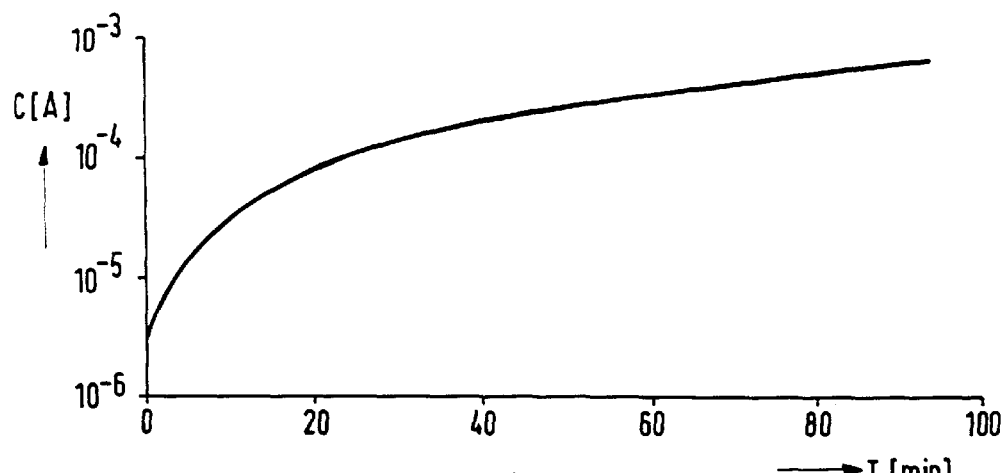
FIG. 3 shows the time-dependence T of the current C (graph A), the brightness (luminance) L (graph B) and the EL efficiency e (graph C), respectively, of a device in accordance with the invention which is operated at a voltage of 22 V.
Figure 3B:
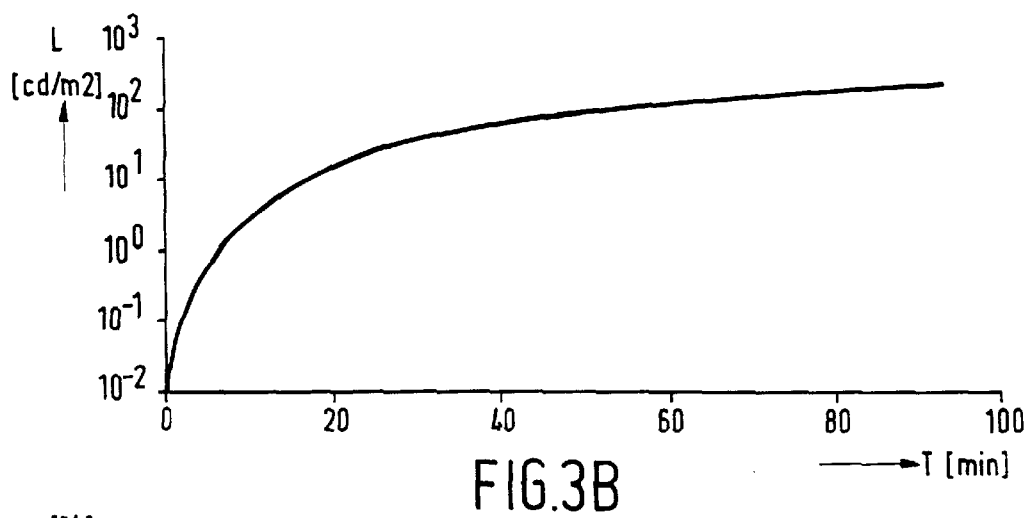
Figure 3C:
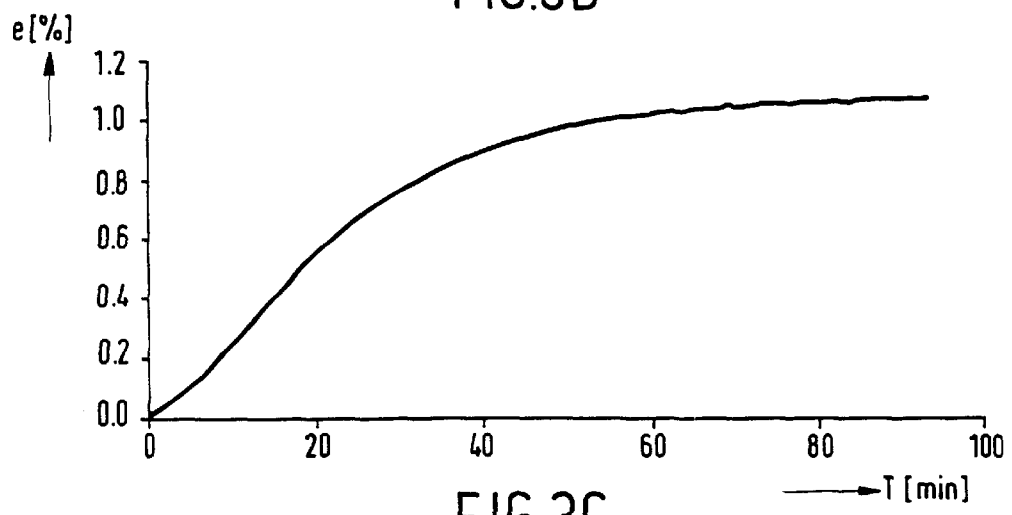

The EL device 1 thus obtained is activated by applying a voltage of 22 V across the electrodes, the gold electrode serving as the negative electrode. After some time, orange light is emitted. FIGS. 3A, 3B and 3C show, respectively, the time-dependence of the current (A), the luminance and the EL efficiency at the activating voltage of 22 V. The luminance is measured by means of a photodiode and a Keithley 617 electrometer. A photocurrent of $8 \times 10^4$ pA corresponds to 100 Cd/m². The EL efficiency is determined in a calibrated "integrating sphere", in which the overall quantity of light which leaves the device, including via the sides, is measured by means of a calibrated photodiode. FIGS. 3A, 3B and 3C show that the performance of the device improves in the course of time, the final EL efficiency being approximately 1.1%. Comparable characteristics are attained at a lower activating voltage, yet, in this case, the time necessary to acquire the same current is longer. The activating time also increases with the layer thickness.

Figure 4A:
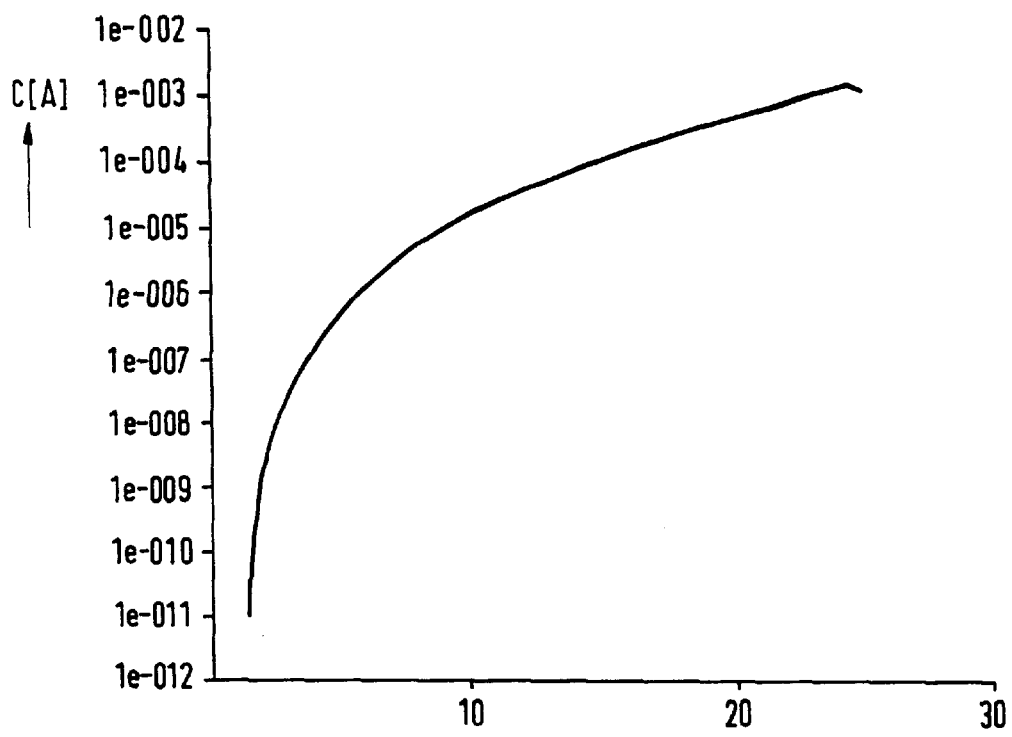
FIG. 4 shows the current-voltage characteristic C-V (graph A) and the luminance-voltage characteristic L-V (graph B) of a device in accordance with the invention.
Figure 4B:
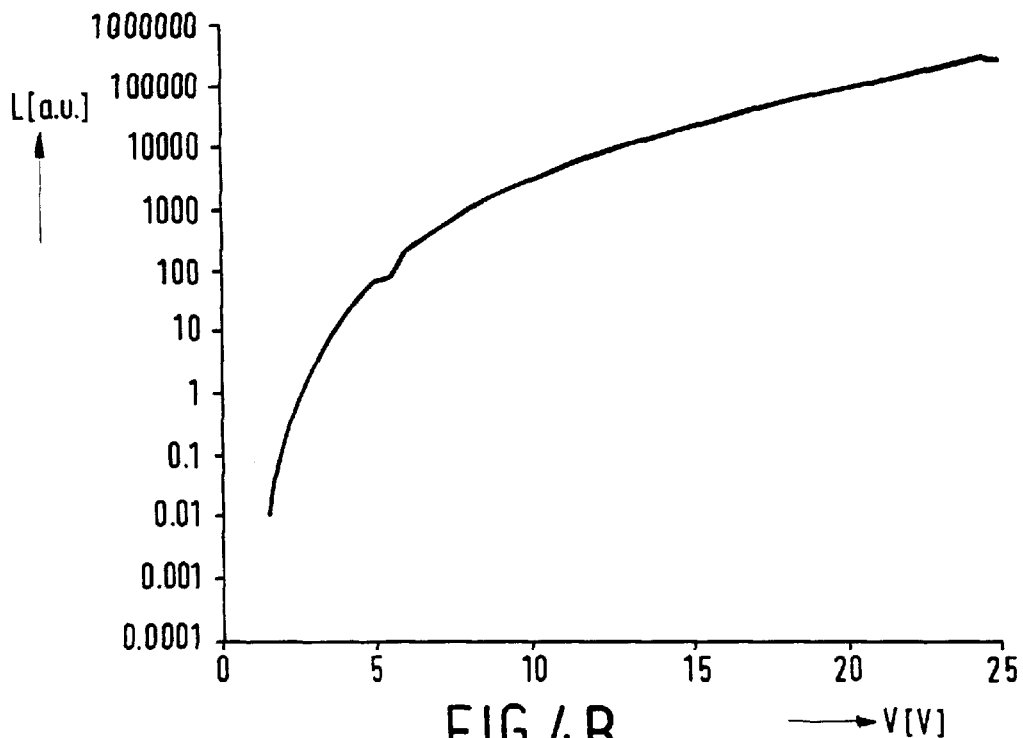

FIG. 4A shows the current (A) as a function of the voltage (V) and FIG. 4B shows the luminance in arbitrary units as a function of the voltage (V), of a device, immediately after said device has been activated at a voltage of 22 V. It has been found that the device starts to emit light at a voltage as low as approximately 2 V, which corresponds to the band gap of the electroluminescent material.

Subsequently, the device is maintained at a zero voltage for several hours. If, subsequently, a voltage of 22 V is applied, the time-dependence of the current, of the quantity of light and of the EL efficiency are substantially equal to that outlined in FIGS. 3A, 3B and 3C.

Exemplary embodiment 2

An EL device is manufactured as described in exemplary embodiment 1, with this difference that for the negative electrode use is made of indium instead of gold. Said indium electrode is provided by applying molten indium to the pre-heated ionic layer by means of a pipette and, subsequently, allowing it to cool in air so that the indium solidifies. The surface area of the negative electrode is approximately 1 cm².

Subsequently, the device is activated at a voltage of 15 V until the brightness is 200 Cd/m². Next, the voltage is reduced to 6 V, as a result of which the brightness decreases to 50 Cd/m². The EL efficiency of the device is approximately 1.0%. Said EL efficiency is substantially equal to that of the EL device comprising the gold electrode of exemplary embodiment 1. If the device is continuously operated at 6 V, the luminance of the emitting areas remains substantially constant. The service life amounts to several days. The device is in direct contact with the outside air during the entire period of time to which this exemplary embodiment relates.

COMPARATIVE EXAMPLE 1

An EL device 1 is manufactured as described in exemplary embodiment 2, with this difference that in the conjugated polymer used in this comparative example, —XR$_5$ is equal to —OCH$_3$. The preparation of this polymer is described in Braun et. al., Synth. Met., 66 (1994). In this case, layer 4 in FIG. 1 is not ionic. The current intensity measured at an applied voltage of 6 V is comparable to that measured in exemplary embodiment 2. However, hardly any light emission is observed. The EL efficiency is less than 0.2%. If the experiment is repeated with a negative electrode of gold, the EL efficiency is even less than 0.01%.

COMPARATIVE EXAMPLE 2

An EL device 1 is manufactured as described in comparative example 1, with this difference that the device is manufactured in nitrogen and, instead of the indium cathode, use is made of a calcium cathode obtained by vacuum deposition. If a voltage of 5 V is applied, orange light is emitted having a brightness of 150 Cd/m$^2$ and an EL efficiency of 1.0%. The service life of the device thus operated in nitrogen amounts to 100 hours. If such a device is operated under ambient conditions, dependent upon the speed of acting, light emission typically takes place during only approximately ten seconds.

COMPARATIVE EXAMPLE 3

An EL device 1 is manufactured as described in comparative example 1, with this difference that the layer 4 in FIG. 1 consists of a mixture of fully (>98%) conjugated poly[2-methoxy-5-(2,7-dimethyloctyloxy)-1,4-phenylenevinylene] and approximately 1 to 10 mol. % LiBF$_4$. The preparation of the polymer is described in Braun et al., Synth. Met., 66 (1994), 75. The polymer exhibits orange photoluminescence. The layer 4 is an ionic layer of which both the anion BF$_4^-$ and the cation Li$^+$ are mobile. At high salt concentrations, the layer is scattering.

Under ambient conditions, a voltage of 10 V is applied to the electrodes of the device thus obtained, the indium electrode being used as the negative electrode. The applied voltage causes the color of the layer to change from orange to greenish black in a short period of time, and electroluminescence can be observed only for several hours.

Exemplary embodiment 3

Exemplary embodiment 2 is repeated, with this difference that the polymer used is a polymer in accordance with formula (I), wherein R$_1$ and R$_3$ are equal to 3,7-dimethyloctyl, R$_2$ and R$_4$ are equal to methyl, R$_5$ is equal to [—CH$_2$CH$_2$N(CH$_3$)$_3$]$^+$I$^-$ and m/(n+m)=0.04. The device exhibits a comparable performance, however, the light emitted is green and emission is observed from 3 V.

Exemplary embodiment 4

Exemplary embodiment 2 is repeated, with this difference that the polymer used is a polymer in accordance with formula (II), wherein R$_1$ and R$_3$ are equal to methoxy, R$_2$ is equal to 3,7-dimethyloctyloxy, R$_6$ is equal to [—CH$_2$CH$_2$N(CH$_3$)$_3$]$^+$I$^-$, and m/(m+n) ranges from 0.01 to 0.25, which polymer is obtained in accordance with synthetic recipe 2. After activating for approximately 2 minutes at 15 V, the device thus manufactured has a luminance of 100 Cd/m$^2$ at 5 V. The EL efficiency then amounts to 1%. Orange-coloured light is emitted, which is observed already at 2.5 V. The service life of the device is much better than that of corresponding devices in which polymers in accordance with formula (IA/IB) are used and amounts to more than 30 days under ambient conditions.

Comparable results are obtained with the polymer in which R$_3$ and R$_6$ have the above-mentioned meaning, R$_1$ is H and R$_2$ is 3-methoxyphenyl, which polymer emits green light; and comparable results are also obtained with the polymer in which R$_3$ and R$_6$ have the above-described meaning, R$_1$ is methyl and R$_2$ is 4,7,7-trimethylheptyl, which polymer emits green light. Devices manufactured by means of terpolymers obtained from monomers whose corresponding homopolymers emit, respectively, green and orange light, emit yellow light.

Exemplary embodiment 5

Exemplary embodiment 4 is repeated, with this difference that the service life test is carried out by accommodating the device in a sealed glass container which is saturated with water vapour. The service life is shorter than that of devices exposed to air, yet it is still more than one week.

Exemplary embodiment 6

An EL device was manufactured as described in exemplary embodiment 2, with this difference that the ITO electrode is structured in such a manner that it comprises 100 independently addressable parallel lines per 5 cm. The polymer used is the same as that of exemplary embodiment 4, the fraction m/(m+n) being equal to 0.07. The layer thickness amounts to approximately 150 nm.

Using a new line each time, it was determined how long it takes to reach a specific luminance at a specific voltage and temperature. At room temperature, it takes 2 minutes, at 50° C. it takes 30 seconds and at 80° C. it takes only 10 seconds. This experiment shows that the device comprises mobile ions whose mobility is governed by temperature.

Subsequently, the device is immersed in cyclohexanone for 24 hours, so that the ionic layer swells while taking up cyclohexanone. The swollen device is subjected to a symmetrical square-wave voltage which is applied across the electrodes with an amplitude of 3 V and a frequency of 100 kHz. At this frequency, no light emission is observed, which shows that the ions are not active at this frequency because their mobility is too low. Subsequently, the frequency is reduced until light emission can be observed, which occurs at 450 Hz. This maximum frequency at which light emission can still be observed is determined in accordance with the same "frequency sweep" at different voltage amplitudes. The results are shown in the following Table.

| voltage (V) | frequency (Hz) |
| --- | --- |
| 3 | 450 |
| 4 | 1200 |
| 5 | 3500 |
| 7.5 | 8000 |
| 10 | 20000 |

For comparison, the frequency is at least 1 Hz in the case of a device which is not swollen. These results show that the mobility of the mobile ion can be increased by causing the layer to swell in a solvent, and that the mobility of the mobile ions is governed by the field.

Exemplary embodiment 7

Figure 2:
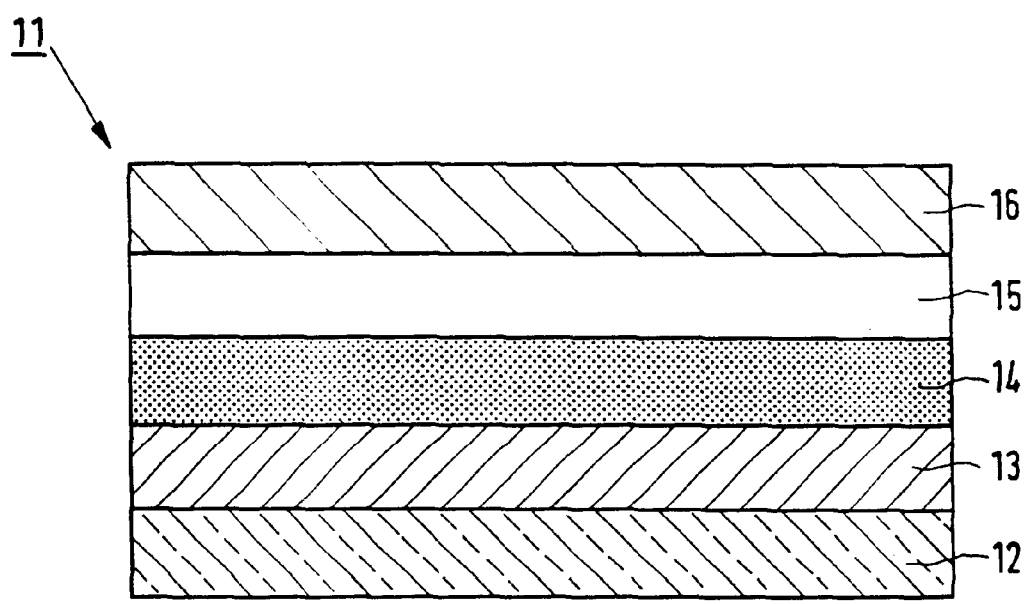
FIG. 2 is a cross-sectional view of a multilayer device in accordance with the invention.

FIG. 2 shows, schematically and not to scale, a cross-sectional view of an EL device 11 which can be manufactured as follows. A precursor layer of the non-quaternized variant of the polymer of exemplary embodiment 2 is provided on a glass substrate 12 coated with an ITO layer 13, such as used in exemplary embodiment 2. Subsequently, the precursor layer is exposed for some time to an alkylating methyliodide vapour, as a result of which said layer is quaternized to a certain depth, thereby forming the ionic layer 15. The non-alkylated part of the precursor layer forms the additional layer 14. Subsequently, an indium-electrode layer 16 is applied to the ionic layer 15 in the manner described in exemplary embodiment 2. A number of devices in which the time during which the precursor layer is exposed to methyliodide vapour is varied, is manufactured in a similar manner. The devices thus obtained are activated for some time at a voltage of 15 V and, subsequently, the luminance and service life are determined at 5 V. The results of this series of measurements are listed in the following Table.

| No. | time of treatment with MeI (min) | activating at 15 V (min) | luminance at 5 V (Cd/m²) | service life at 5 V |
|---|---|---|---|---|
| 1 | 0 | 10 | 0 | — |
| 2 | 2 | 10 | 0 | — |
| 3 | 5 | 5 | 10 ± 10 | — |
| 4 | 23 | 2 | 20 ± 10 | >2600 h |
| 5 | 31 | 2 | 20 ± 10 | >2600 h |
| 6 | 100 | <2 | 50 ± 10 | >2600 h |
| 7 | 1080 | <2 | 50 ± 10 | ca. 48 h |
| 8 | — | — | 50 ± 10 | ca. 48 h |

Sample 8 serves as a reference and is manufactured in accordance with exemplary embodiment 2. Clearly, a higher ratio between the ionic layer thickness and the additional layer thickness corresponds to a higher luminance and a shorter activating time. As regards the service life, it has been found that the presence of the additional layer is very advantageous. After 2600 hours, the emitting surface area has decreased by 60%, however, the brightness of the remaining emitting regions is almost as high as before.

Comparable results are obtained if the alkylation process is carried out by exposing the layer to a solution of ethyl-p-toluenesulphonate in acetone for several minutes, allowing the layer to dry, rinsing it with hexane, and drying it.

Exemplary embodiment 8

To manufacture an EL device 11, a glass/ITO substrate 12/13, as used in exemplary embodiment 2, is provided with an approximately 150 nm thick, additional layer 14 of poly[2-methoxy-5-(2,7-dimethyloctyloxy)-1,4-phenylenevinylene] by spin coating. Subsequently, an approximately 10 nm thick ionic layer 15 is provided by dip coating in a highly diluted (0.01 to 0.1%) solution of the polymer, as used in exemplary embodiment 2, in acetone/cyclohexanone (20:1). Subsequently, an indium-electrode layer 16 is applied to said layer, as described in exemplary embodiment 2. The device thus obtained is activated for several minutes at 15 V. Subsequently, a voltage of 5 V is applied. At said voltage, the luminance is approximately 100 Cd/m², the EL efficiency is approximately 1% and the service life amounts to several weeks. The color of the light emitted corresponds to the photoluminescence of the additional layer.

What is claimed is:

1. An electroluminescent device comprising a first electrode, a second electrode and an ionic, organic layer in contact with said first electrode, said layer comprising either an ionogenic conjugated compound comprising mobile ions or a conjugated non-ionogenic compound and an ionogenic non-conjugated compound comprising mobile ions, which mobile ions are mobile relative to said first electrode and have a mobility of about $10^{-14}$ cm²/Vs or more, and immobile ions, immobile relative to said first electrode and have a mobility of not more than about $10^{-19}$ cm²/Vs characterized in that only negatively charged ions or positively charged ions are mobile relative to said first electrode, characterized in that the ionic layer comprises a quaternary amine as the immobile ion.

2. An electroluminescent device comprising a first electrode, a second electrode and an ionic, organic layer in contact with said first electrode, said layer comprising either an ionogenic conjugated compound comprising mobile ions or a conjugated non-ionogenic compound and an ionogenic non-conjugated compound comprising mobile ions, which mobile ions are mobile relative to said first electrode and have a mobility of about $10^{-14}$ cm²/Vs or more, and immobile ions, immobile relative to said first electrode and have a mobility of not more than about $10^{-19}$ cm²/Vs characterized in that only negatively charged ions or positively charged ions are mobile relative to said first electrode, characterized in that said device comprises an additional layer, which layer is situated between the second electrode and the ionic, organic layer and which contains a conjugated compound and mobile ions in a quantity such that their overall charge is compensated by immobile ions.

3. An electroluminescent device comprising a first electrode, a second electrode and an ionic, organic layer in contact with said first electrode, said layer comprising either an ionogenic conjugated compound comprising mobile ions or a conjugated non-ionogenic compound and an ionogenic non-conjugated compound comprising mobile ions, which mobile ions are mobile relative to said first electrode and have a mobility of about $10^{-14}$ cm²/Vs or more, and immobile ions, immobile relative to said first electrode and have a mobility of not more than about $10^{-19}$ cm²/Vs characterized in that only negatively charged ions or positively charged ions are mobile relative to said first electrode, characterized in that the ionic layer comprises a copolymer of the formula II

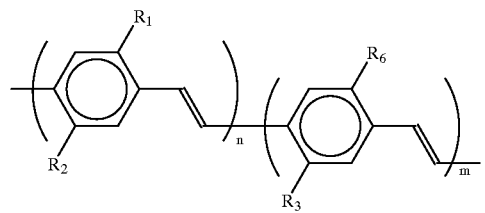

wherein the degree of polymerization n+m varies from 5 to 1,000,000, $R_1$, $R_2$ and $R_3$ are chosen to be equal to —X—R—H or —R—H, $R_6$ is equal to —R—$K_1A_1$, —R—$A_2K_2$, —X—R—$K_1A_1$ or —X—R—$A_2K_2$, R is branched or unbranched $C_1$–$C_{20}$ alkylene or phenylenealkylene, X is sulfur or oxygen, $K_1$ is an ammonium group, $A_1$ is selected from the group consisting of I⁻, Tos⁻ and other Bronsted acid anions, $A_2$ is $CO_2^-$, or $SO_3^-$ and $K_2$ is $NR_4^+$ or alkali.

4. An electroluminescent device as claimed in claim 3, characterized in that the ionic layer comprises a copolymer in accordance with formula (II), wherein the degree of polymerization n+m varies from 5 to 1,000,000, $R_1$ is methoxy, $R_2$ is 3,7-dimethyloctyloxy, $R_3$ is methoxy and $R_6$ is [—CH₂CH₂N(CH₃)₃]⁺I⁻.

5. An electroluminescent device comprising a first electrode, a second electrode and an ionic, organic layer in contact with said first electrode, said layer comprising either an ionogenic conjugated compound comprising mobile ions or a conjugated non-ionogenic compound and an ionogenic non-conjugated compound comprising mobile ions, which mobile ions are mobile relative to said first electrode and have a mobility of about $10^{-14}$ cm$^2$/Vs or more, and immobile ions, immobile relative to said first electrode and have a mobility of not more than about $10^{-19}$ cm$^2$/Vs characterized in that only negatively charged ions or positively charged ions are mobile relative to said first electrode, characterized in that the ionic layer comprises a polymer of the formula IA/IB

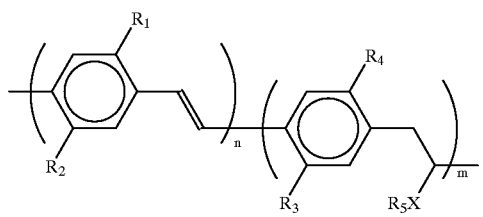

(IA)

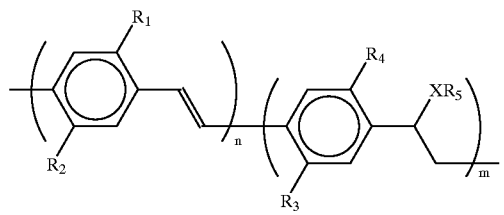

(IB)

wherein the degree of polymerization n+m varies from 5 to 1,000,000, $R_1$, $R_2$, $R_3$ and $R_4$ are each independently —X—R—H or —R—H, $R_5$ is —R—K$_1$A$_1$ or —R—A$_2$K$_2$, wherein R is branched or unbranched $C_1$–$C_{20}$ alkylene or phenylene-alkylene, X is sulfur or oxygen, $K_1$ is an ammonium group, $A_1$ is selected from the group consisting of I$^-$, Tos$^-$ and other Bronsted acid anions, $A_2$ is —CO$_2^-$ or SO$_3^-$ and $K_2$ is selected from the group consisting of NR$_4^+$ and alkali.

* * * * *